United States Patent [19]

Grossa et al.

[11] Patent Number: 5,587,272

[45] Date of Patent: Dec. 24, 1996

[54] PROCESS FOR PREPARING MULTIPLE COLOR PROOFS

[75] Inventors: Mario Grossa; Udo D. Bode, both of Dreieich; Manfred Sondergeld, Muhlheim/Main; Karl-Heinz Wiedenmann, Rodermark, all of Germany; Ronald J. Convers; Steven M. Kalo, both of Towanda, Pa.; Ashok K. Kudva, Hendersonville, N.C.

[73] Assignee: E. I. Du Pont de Nemours and Company, Wilmington, Del.

[21] Appl. No.: 569,043

[22] Filed: Dec. 7, 1995

[30] Foreign Application Priority Data

Dec. 27, 1994 [DE] Germany ............... 44 46 869.5

[51] Int. Cl.⁶ ............... G03C 11/12; G03F 7/28; G03F 7/42
[52] U.S. Cl. ............... 430/257; 430/256; 430/258; 430/259; 430/263; 430/291; 430/292; 430/293; 430/952
[58] Field of Search ............... 430/256, 257, 430/258, 291, 292, 293, 952

[56] References Cited

U.S. PATENT DOCUMENTS

| | | | |
|---|---|---|---|
| 3,060,025 | 10/1962 | Burg et al. | 96/28 |
| 3,582,327 | 6/1971 | Boyd et al. | 96/28 |
| 3,620,726 | 11/1971 | Chu et al. | 96/27 R |
| 3,649,268 | 3/1972 | Chu et al. | 96/27 R |
| 4,215,193 | 7/1980 | Manger et al. | 430/291 |
| 4,243,741 | 1/1981 | Abele et al. | 430/270 |
| 4,275,140 | 6/1981 | Neiss | 430/254 |
| 4,291,114 | 9/1981 | Berggren et al. | 430/253 |
| 4,356,253 | 10/1982 | Buzzell | 430/291 |
| 4,461,823 | 7/1984 | Held | 430/120 |
| 4,806,451 | 2/1989 | Frohlich | 430/291 |
| 4,902,363 | 2/1990 | Delaney et al. | 156/230 |
| 4,902,592 | 2/1990 | Matsumoto et al. | 430/257 |
| 4,935,331 | 6/1990 | Platzer et al. | 430/254 |
| 4,939,029 | 7/1990 | Delaney et al. | 428/314.4 |
| 4,948,704 | 8/1990 | Bauer et al. | 430/291 |
| 5,090,774 | 2/1992 | Dolla | 296/188 |
| 5,126,226 | 6/1992 | Frohlich et al. | 430/257 |
| 5,210,001 | 5/1993 | Frohlich et al. | 430/252 |
| 5,240,810 | 8/1993 | Barjesteh | 430/257 |
| 5,380,620 | 1/1995 | Namiki et al. | 430/257 |
| 5,534,380 | 7/1996 | Bodager et al. | 430/291 |

FOREIGN PATENT DOCUMENTS

| | | |
|---|---|---|
| 0523325A1 | 1/1993 | Germany . |
| 935627 | 9/1963 | United Kingdom . |
| 945807 | 1/1964 | United Kingdom . |

*Primary Examiner*—Richard L. Schilling

[57] ABSTRACT

This invention makes available processes for preparing images, especially color proofs. A layer with imagewise tacky and nontacky areas is toned. Toner adhering to the tacky areas is transferred first onto a temporary support and from there onto an image receptor.

10 Claims, No Drawings

PROCESS FOR PREPARING MULTIPLE COLOR PROOFS

FIELD OF THE INVENTION

This invention relates to a process for preparing images, particularly color proofs, whereby a layer having imagewise tacky and nontacky areas is toned, and the toner adhering to the tack), areas is transferred first onto a temporary support and from there onto an image receptor. The process enables the preparation of multiple images and color proofs.

BACKGROUND OF THE INVENTION

Halftone color separations are used in reprography as copy masters for preparing offset or relief printing plates. Before the printing plates are exposed, the color separations are checked in color proofing processes to determine whether the ultimate printing result will be a tonally accurate reproduction of the original. According to general standard specifications, for example, high quality offset printing requires a resolution of 2%–98% dots, even 1%–99% dots on modern printing machines, for a 60 lines/cm screen. It is especially difficult to achieve satisfactory resolution of the small 2% dots in the highlights and 98% dots in the shadows. For good tonal reproduction, it is especially important that screen dots of the same size be sharply delineated over the entire area and reproduced uniformly, that is, without size variations.

A considerable proportion of these color proofs is supplied by proofing presses, essentially small offset printing presses for the smallest runs. U.S. Pat. No. 5,380,620 discloses a process that uses special, photosensitive, aqueous-developable materials and can be used for color proofing processes. These materials have areas, formed by special auxiliary layers, that accept or repel printing inks, analogous to dry offset plates. Washoff processes have the important disadvantage that waste water containing chemicals must be disposed of, and additional developing processors must be used. U.S. Pat. No. 5,380,620 does mention briefly a material that can be used without aqueous development. However, these offset materials must use very special, fluorine-containing, diazo compounds to make areas that accept or repel printing inks. Tonable photopolymerizable materials are not disclosed.

These are known in other color proofing processes using photosensitive recording materials in which differences in the tackiness of exposed and unexposed areas of the photosensitive layer are used to make the image. German Patent 12 10 321, U.S. Pat. Nos. 3,620,726, 3,582,327, 3,649,268, 4,356,253, 4,948,704 and 4,243,741 disclose a reproduction process, wherein a tacky, photopolymerizable, recording material, comprises a support and a photopolymerizable layer containing at least one addition-polymerizable monomer, and a photopolymerization initiator. The recording material is hardened by imagewise exposure, whereupon the exposed image areas lose their tackiness. The latent image is made visible by the application of suitable toners that adhere only to the unexposed tacky areas and can be removed from the exposed nontacky areas. This process yields positive, optionally color, images of the original similar in appearance to images produced by the use of printing inks.

The toners, comprising predominantly finely divided powders, can be applied by being dusted on the imagewise exposed surface. According to another embodiment, the toner can also be loosely bonded on a special support and transferred by bringing this support into contact with the imagewise exposed layer. Such transfer layers are significantly more advantageous, because handling is considerably simpler, cleaner, and more friendly to the environment. Color proofing processes using pigmented transfer coatings are disclosed in German Patents 12 05 117 and 29 49 462, U.S. Pat. Nos. 4,806,451, 4,902,363, 4,939,029, 5,126,226, 5,210,001, 5,090,774, and German Patent 41 20 793, and in U.S. Pat. No. 4,935,331.

However, the cited photographic color proofing processes have the disadvantage that the preparation of multiple copies of the color separations is time-consuming and costly. New photosensitive material must be exposed imagewise and toned to obtain each copy and multiple photosensitive materials must be processed for polychromatic images. Another disadvantage is that the finished color proofs contain photopolymerized and unphotopolymerized material, which can lead to alterations in colors and changes in dot growth.

U.S. Pat. No. 3,060,025 and EP-C 0 034 816 disclose the preparation of multiple copies of a color separation by transfer of an imagewise color layer onto a receptor. However, these processes also have disadvantages. U.S. Pat. No. 3,060,025 does indeed mention the possibility of making multiple copies by the use of only one photosensitive material, but the final image also contains photosensitive starting material. The process of EP-C 0 034 816 uses toners that become tacky when heated and retain this tackiness a while after cooling, so that a portion of the toner layer can be transferred repeatedly. However, polychromatic images are difficult to prepare this way, because part of the transferred toner layer is transferred back onto the preceding color layer when a new color is applied.

Partial transfer of toner layers also alters colors. As contact exposure of the photosensitive material is not possible, because specular images would usually be obtained, the quality required for color proofs cannot be achieved with this process. This problem can be circumvented by the use of temporary supports, as described in U.S. Pat. No. 5,240, 810, but the final proof contains additional adhesive layers that af quality.

The complex shear moduli of known photopolymerizable layers utilized in proofing applications, for example CROMALIN® 4BX and CROMALIN® 8BX, are outside the range of moduli described below.

The problem involved in the invention is to make available multiple, right-reading copies of a color separation or a polychromatic image without using a time-consuming and costly process, while avoiding the indicated disadvantages of known processes, and maintaining constant from the first to the last copy the color locus and resolution required for the color proof.

This problem is solved by the process described herein.

SUMMARY OF THE INVENTION

This invention provides a process for preparing images by a) producing tacky and nontacky areas on a photopolymerizable layer (A) by imagewise exposure, b) bringing the exposed Layer (A) into contact with a pigmented transfer layer (B) on a support (C), c) peeling off the support (C), whereupon the pigmented transfer layer (B) is transferred onto the tacky areas of the exposed layer (A) and is removed from the nontacky areas of the exposed layer (A), d) bringing the toned layer (A) into contact with a temporary support (D), e) removing the temporary support (D), whereupon the pigmented transfer layer (B) adhering on the tacky areas of the toned layer (A) is transferred onto the temporary support (D), f) bringing the temporary support (D) into contact with an image receptor (E), g) removing the temporary support (D), whereupon the pigmented transfer layer (B) adhering to the temporary support is transferred onto the image receptor (E), and h) repeating steps b) through g) at least once, whereby, in each instance, a new pigmented transfer layer (B), a new temporary support (D), and a new image receptor (E) are used. In a different embodiment, the invention provides a process for the preparation of multicolor proofs from only one tonable photopolymerizable layer and by a single exposure for each color.

DETAILED DESCRIPTION OF THE INVENTION

The process of the invention for making images makes it possible to prepare right-reading color proofs, using the advantages of a contact exposure of a tonable, photopolymerizable layer and subsequent transfer of the toner in the image areas without transferring the photopolymerizable layer.

The new process enables the preparation of multiple color proofs from only one tonable photopolymerizable layer and by a single exposure for each color. Because the properties of the tonable layer are not affected by the contact with the pigmented layer and because of complete transfer of the pigmented image areas onto the temporary support, the receptivity for toner in the succeeding steps of preparing additional color proofs is not noticeably changed.

The process of the invention for preparing multiple color proofs includes the following steps:

a) producing tacky and nontacky areas on a photopolymerizable layer (A) by imagewise exposure, b) bringing the exposed Layer (A) into contact with a pigmented transfer layer (B) on a support (C), c) peeling off the support (C), whereupon the pigmented transfer layer (B) is transferred onto the tacky areas of the exposed layer (A) and is removed from the nontacky areas of the exposed layer (A), d) bringing the toned layer (A) into contact with the temporary support (D) of this invention, e) removing the temporary support (D), whereupon the pigmented transfer layer (B) adhering on the tacky areas of the toned layer (A) is transferred onto the temporary support (D), f) bringing the temporary support (D) into contact with an image receptor (E), g) removing the temporary support (D), whereupon the pigmented transfer layer (B) adhering on the temporary support is transferred onto the image receptor (E), and h) repeating steps b) through g) at least once, whereby, in each instance, a new pigmented transfer layer (B), a new temporary support (D), and a new image receptor (E) are used.

For the preparation of multiple color proofs in the above-described process, the following steps are performed after step e):

i) repeating steps b) to e) at least once, using in each case a new pigmented transfer layer (B) and a new temporary support (D), j) repeating steps a) to e) and i) at least once, using in each case a new photopolymerizable layer (A), a new pigmented transfer layer (B), and the temporary supports D toned in the preceding steps, k) bringing the temporary supports D in contact with an image receptor (E), and l) removing the temporary supports D, whereupon the pigmented transfer layers B adhering on the temporary supports are transferred onto the image receptors E.

A variation of this process for making multiple color images provides for the following steps after step e) of the monochromatic process:

m) repeating steps a) to e) at least once, using in each case a new photopolymerizable layer (A), a new pigmented transfer layer (B), and the temporary support (D) toned in the preceding steps, n) bringing the temporary support (D) into contact with an image receptor (E), o) removing the temporary support (D), whereupon the pigmented transfer materials B adhering on the temporary support are transferred onto the image receptor (E), and p) repeating steps b) to e), m) to o) at least once, using new pigmented transfer materials (B) in steps b) and m), a new temporary support (D) in step d), and a new image receptor (E) in step n).

The following materials are preferred for the tonable photopolymerizable layers. The essential components of these layers, which are $\geq 10$ μm thick, preferably $\geq 15$ μm, are at least one polymeric binder, at least one ethylenically unsaturated photopolymerizable monomer, and at least one photoinitiator. In addition, the photo-polymerizable layers must have a complex shear modulus of 170 to 700 kPa at 25° C. The complex shear modulus is measured at 10 Hz and tau 9750 Pa on a Physica Rheometer MC 120 with an MP 30 measuring unit (see DIN 53018, Part 1, for the geometry). The preferred complex shear modulus is 200–500 kPa at 25° C.

The desired tackiness of the photopolymerizable layers is 8–40 g/cm$^2$, preferably 10–30 g/cm$^2$. It is measured as the separation force for a sensor having an area of 0.9 cm$^2$ and a bearing pressure of 2.5 g for 30 seconds contact time. The optical density of the photopolymerizable layers is usually at least 1.4, preferably 1.4–4.8, especially 2.4 at the maximum sensitivity of the photopolymerizable material, which is usually in the ultraviolet range, preferably in the wavelength range between 250 and 450 nm, especially 360 nm.

The polymeric binders of the photopolymerizable layers can be, for example, the polymers containing crosslinkable, salt-forming groups disclosed in U.S. Pat. Nos. 4,948,704 and 4,243,741. These are preferably polyacrylates containing carboxyl groups, polymethacrylates or copolymers of acrylic acid or methacrylic acid with other monomers, such as, for example, (meth)acrylic acid esters and/or other (meth)acrylic acid derivatives, vinyl compounds, styrene, butadiene, and related monomers. Thermoplastic acrylate and/or methacrylate polymers are preferred, especially copolymers of (meth)acrylic acid and methyl and/or ethyl acrylate or methacrylate.

The carboxyl groups are crosslinked preferably by polyvalent metal compounds of Groups IIA–IVA, IIB–IVB, and VIIB of the Periodic Table, especially zinc compounds. The metal compounds can be added to the photopolymerizable layer, for example, in the form of their salts, oxides, and alkoxides, or as chelates. These compounds are added in quantities such that at least 10% by weight of the salt-forming groups present in the polymeric binder are crosslinked. Admixtures of non-crosslinkable polymers, such as, for example, polyacrylates, polystyrenes, or polyvinyl acetates, can be used to adjust to the desired viscoelastic (shear modulus) range. However, this can also be accomplished by the degree of crosslinking of the polymeric binder through selection of the metal ion quantity. The quantity of polymeric binder is generally 20–80% by weight, preferably 30–60% by weight, relative to the total mass of the dry layer.

Other components of the polymerizable layers are ethylenically unsaturated monomers and/or plasticizers. The preferred monomers and/or plasticizers have an average molecular weight $M_w$ (weight average) of 200–1000, preferably 200–500. Particularly preferred, ethylenically, unsaturated monomers are polyfunctional monomers of the (meth)acrylate type, such as, for example, trimethylolpropane trimethacrylates, bisacrylates or methacrylates of bisphenol A, pentaerythritol tetraacrylate or methacrylate. Preferred plasticizers useful in the invention are diffusible plasticizers, for example, glycerol triacetate, di(2-ethyl)hexylphthalate, or aliphatic oligomeric esters. The quantity of ethylenically unsaturated monomers is generally 10–70% by weight, preferably 20–50% by weight, relative to the total mass of the dry layer. The quantity of plasticizer is usually 5–15% by weight.

Useful photopolymerization initiators for the photopolymerizable layers can be all compounds known for this purpose. Examples of suitable photoinitiators or photoinitiator systems are benzil dimethylketal, benzoin, benzoin isopropyl ether, alpha-methyl benzoin, 1,4-naphthoquinone, Michler's ketone and benzophenone alone or together, a combination of hexaaryl bisimidazoles and proton donors, such as, for example, mercaptobenzoxazole, and systems of substituted thioxanthones and tertiary amines. Combinations of various initiators are also possible. The concentration of the photoinitiator system is preferably 0.01–15% by weight, relative to the total mass of the dry layer.

In addition to the cited components, the photo-polymerizable layers can contain other additives, such as, for example, sensitizers, fillers, thermal stabilizers, antioxidants, coating aids, and the like. The photopolymerizable layers can be applied onto suitable supports according to known processes from customary solvents, preferably from organic solvents, such as, for example, methylene chloride, toluene/methanol mixtures, or other mixtures of aromatic solvents and alcohols, esters, or ketones, and then dried.

Examples of suitable supports are synthetic resin films of polyethylene, polypropylene, polyamides, or polyesters. Polyethylene terephthalate films are especially preferred, particularly in a thickness $\geq 100$ μm.

Flexible synthetic resin films are used as a cover layer, such as, for example, polyethylene, polypropylene, or polyester films, especially polyethylene terephthalate films, primarily 6–12.5 μm thick, or polypropylene films, 10–24 μm thick, preferably $\leq 18$ μm.

For the preparation of the imagewise tacky and nontacky areas, the photopolymerizable layers are exposed through a color separation positive by a suitable radiation source, such as, for example, xenon lamps, mercury vapor lamps, and lasers.

After the cover film is removed, a pigmented transfer layer is applied and its support is peeled off manually after a holding time of 5–50s, preferably 10–20s, at a velocity of about 50 m/s with the untransferred areas. These process steps are usually conducted at low temperature, that is, below 50° C., preferably below 30° C., especially at 22° C., between two rotating cylinders in a laminator. Usually immediately after its application, the pigmented transfer layer is peeled off at a high separation velocity, preferably at 10–50 cm/s, most preferably at 10–30 cm/s. The separation velocity is the velocity at which the separation line of the two layers travels.

The preferred pigmented layers are the materials described below. The essential components of these pigmented transfer layers are at least one polymeric and/or plasticized polymeric binder and at least one finely divided powder or a finely divided powder and a dissolved dye. It is essential that the polymeric binder be compatible with at least one of the plasticizing components of the photopolymerizable layers, that is, with the ethylenically unsaturated monomer(s) and/or one or more plasticizers. Compatibility is determined, for example, by testing the solubility of the binder components of the pigmented transfer layers in the liquid, plasticizing components of the photopolymerizable layers.

The tackiness of the pigmented layers after being transferred onto the photopolymerizable layers is increased by the compatibility of the pigmented layers' polymeric binders with plasticizing components of the photopolymerizable layers. This enables the subsequent transfer onto the temporary support at 20° C. or a slightly higher temperature up to about 65° C. These pigmented layers have a glass transition temperature of 10°–70° C., preferably 15°–35° C., measured at the primary transition point in the DSC of the pigment layer composition. Preferred polymers or oligomers have a low average molecular weight $M_w$ (weight average), preferably $\geq 20,000$, especially 800–5000. Examples of suitable polymers are aromatic hydrocarbon resins. Styrene polymers and copolymers, especially alpha-methyl styrene/styrene copolymers and alpha-methyl styrene/vinyl toluene copolymers are preferred.

Pigmented transfer layers containing a polymer having 10–50% crystallinity are advantageous. These polymers have a melting point of 25°–60° C. and an average molecular weight $M_w$ (weight average) of 1000–50,000. Examples of such polymers are polyether glycols and polyester glycols. Polycaprolactone and polytetrahydrofuran are particularly useful. The pigmented transfer layers can contain ³15% by weight of a finely divided powder(s) or a combination of finely divided powder(s)/dissolved dye, preferably 15–50% by weight. Many finely divided powders suitable for image recording are disclosed in the prior art, for example, U.S. Pat. Nos. 3,582,327 and 4,215,193. These powders are predominantly pigments, but dissolved dyes combined with a finely divided powder are also useful. Examples are inorganic and organic pigments, fluorescent materials, metal powder in pure form or together with an organic or inorganic carrier powder, such as, for example, titanium dioxide, powdered glass, carbon (carbon black or graphite), metal phthalocyanines, azo dyes, powdered aluminum, copper, iron, gold, or silver, or metal oxides.

The pigmented transfer layers can be prepared according to known methods by casting or printing preferably from organic solvents onto suitable supports and then drying. The pigmented transfer layers are up to 5 μm thick, preferably<3 μm, most preferably 0.5–1.5 μm.

In addition to the aforesaid components, the pigmented transfer layers can contain other additives, such as surfactants, casting aids, slip agents, agents to increase viscosity, agents for adhesion control, and the like.

Suitable supports for the pigmented transfer layers are transparent and opaque synthetic resin films of polyesters, polyamides, polyethylene, polypropylene, polyvinyl chloride, and the like. Supports with low flex resistance are preferred. Especially advantageous are compressible materials, such as described in U.S. Pat. Nos. 4,902,363 and 4,939,029, especially foamed polypropylene films.

The imagewise toned layers A are brought into contact with the temporary supports (D) at an elevated temperature, but preferably at about 60° C. A laminator having two rotating rollers is preferred for this purpose. The materials are separated, preferably immediately, and in particular, at a low separation velocity, preferably at 2–5 cm/s.

The materials described below are used as temporary supports. The essential components of these temporary supports are a flexible, dimensionally stable support film and a 0.5–5 μm, preferably 0.5–3 μm, thick coating containing at least one thermoplastic polymer. This coating material which forms an adhesive layer is compatible with at least one of the plasticizing components of the photopolymerizable layers and/or the pigmented layers. This can be determined, for example, from the solubility parameters of the individual compounds by separate solubility tests or by the effect, measured separately, of plasticizing components on the glass transition temperatures. The coating material must have a softening temperature of about 25° to 130° C., preferably about 30° to 110° C. The softening temperature of the coating material can be adjusted by polymers with an appropriate softening temperature or by plasticized polymers. Preferred polymers are, among others, polymers and copolymers of (meth)acrylates and/or styrene polymers and copolymers.

Suitable plasticizers, preferably having an average molecular weight $M_w$ (weight average) of 800–6000, especially up to 2000, are, for example, di(tridecyl) phthalate and polymeric plasticizers, such as, for example, polyesters of glycols and aliphatic carboxylic acids, such as adipic acid and glutaric acid, or polyacrylates.

An optional interlayer or release layer can be present between the dimensionally stable support film and the coating material. Suitable examples of this are acrylic acid copolymers, preferably acrylic acid/ethylene copolymers. The thickness of the interlayer is 1–15 μm, preferably 2–10 μm. A matte interlayer is especially preferred. Suitable matte agents are known materials, especially silicas. A special advantage of these matte interlayers is that the final proof has a matte surface without additional, color-altering layers being transferred onto the paper.

Polyethylene terephthalate film is preferred for the flexible, dimensionally stable support film. Other polyester films, such as, for example, polyethylene naphthalate can also be used. Preferred support films have high flex strength. The thickness of the support is usually 75–175 μm, preferably 100 μm.

The transfer of the images from the temporary supports onto the final support, preferably paper, is accomplished preferably in a laminator at elevated temperature, preferably 60°–90° C. Afer cooling, the paper is usually separated at a velocity of 5–30 cm/s. The paper can be any known printing paper.

The process of the invention makes it possible to assure the quality required for color proofing in at least five proofs within process times and conditions that can be acceptably maintained in practice. This invention is especially suitable for use in a process, wherein lamination and delamination of tonable layers, of pigmented transfer layers, and of temporary supports to transfer colored image areas take place through rotating cylinders at a velocity of 1–30 cm/s and at a temperature between 20° and 60° C.

The temporary support contains at least one thermoplastic adhesive layer upon a flat, dimensionally stable film base, e.g., poly(ethylene terephthalate). Some useful film bases include Mylar® 400D polyester film (DuPont), 3 mil Mylar® EB-11 polyester film (DuPont), etc. The adhesive layer may transfer to paper with the multicolor image. Gloss of the transferred image on paper may be matched to the paper gloss by embossing a rough surface to the outer surface of the adhesive layer on paper. This embossing can be done by coating the adhesive layer onto a matte film base.

The transfer of the multicolor image to paper can be facilitated by modifying the adhesion of the adhesive layer to the film base. The adhesion may be modified by appropriately changing the surface of the film. One way to change the surface of the film base would include coating it with a "release" layer which adheres well to the film base, but which adheres to the adhesive layer less strongly than the original film base did. This approach allows for the use of a matting agent, e.g., silica, as an ingredient of the release layer to emboss the adhesive layer. The silica in this case unexpectedly eliminates a defect, namely "poor over printability" which is the incomplete transfer of ink from the master to the already colored regions of a colored temporary support.

Tackifying resins incorporated into the adhesive layers can facilitate image transfer to paper, although those resins show no useful performance as adhesive layers by themselves.

The temporary support further comprises a flexible, dimensionally stable base layer selected from polyethylene terephthalate, matte polyethylene terephthalate, or gelatin subbed polyethylene terephthalate; and the thermoplastic polymer of the adhesive layer comprises poly (n-butyl methacrylate; or poly (isobutyl methacrylate); or styrene-butadiene copolymer; or a blend of poly (n-butyl methacrylate) and an aromatic hydrocarbon resin in a ratio by weight of 1:100 to 100:1; or a blend of styrene-butadiene copolymer and polystyrene resin in a ratio by weight of 1:100 to 100:1; or combinations thereof; and the release layer further comprises (a) a blend of maleic acid-methyl vinyl ether copolymer; poly (vinyl alcohol) and a maleic acid neutralizing amine wherein the ratio of maleic acid-methyl vinyl ether to poly (vinyl alcohol) ranges from 1:100 to 100: 1; or (b) a blend of a polyamide resin and a silica matting agent in a ratio by relative weight of 1000:1 to 9:1.

The following examples illustrate this invention in more detail without being limited thereto. Parts and percentages, unless otherwise stated, are by weight.

EXAMPLES

Example 1

The following materials were prepared and processed for the preparation of five 4-color proofs:

A coating solution having the following composition in toluene/methanol was applied onto a 50 μm polyethylene terephthalate film so as to yield, after drying, a 12 μm thick photopolymerizable film having a complex shear modulus of 206 kPa. An 18 μm thick, transparent cover sheet was laminated on the film.

| INGREDIENTS | % BY WEIGHT |
|---|---|
| Ethyl acrylate/acrylic acid copolymer (92/8), $M_w = 7000$, Tg = –14° C. | 5.0 |
| Ethyl acrylate/methyl methacrylate/acrylic acid copolymer (56/37/7), $M_w = 150,000$, Tg = +34° C. | 13.0 |

-continued

| INGREDIENTS | % BY WEIGHT |
|---|---|
| Ethyl acrylate/methyl methacrylate/acrylic acid copolymer (17/71/12) $M_w = 200,000$, $T_g = +70°$ C. | 22.0 |
| Diacrylate ester of a bisphenol A epoxy resin, (viscosity = 1,000,000 cps) | 9.48 |
| Glycerol triacetate | 9.0 |
| Trimethylol propane | 5.5 |
| Stabilizer: hydroquinone monomethyl ether | 0.02 |
| Initiator system: 2-chlorophenyl-4,5-bis(phenyl)-imidazolyl dimer and 2-mercaptobenzoxazole | 2.75 |
| Trimethylol propane trimethacrylate | 23.0 |
| Polycaprolactone, $M_w = 10,000$ | 0.25 |
| Zinc acetylacetonate | 4.0 |
| Ethyl Michler's ketone | 2.0 |
| Polyoxyethylene(4)-lauryl ether | 4.0 |

Each of the following coating solutions in toluene was applied onto a 60 μm thick polypropylene foam film, so as to yield, after drying, a 1 μm thick, pigmented, transfer layer.

| INGREDIENTS | % BY WEIGHT |
|---|---|
| Coating Solution for Cyan Pigment Layer: | |
| Alpha-methyl styrene/styrene copolymer, $M_w = 1200$ | 53.25 |
| Polytetrahydrofuran, $M_w = 1000$ | 13.32 |
| Pigment blue 15; C.I. 74160 | 28.89 |
| Dispersing agent: Disperbyk 163 available from BYK Chemie | 4.27 |
| Coating Solution for Magenta Pigment Layer: | |
| Alpha-methyl styrene/styrene copolymer, $M_w = 1200$ | 34.77 |
| Polytetrahydrofuran, $M_w = 1000$ | 10.83 |
| Dicyclohexyl phthalate | 5.46 |
| Coating aid: ethyl cellulose EC/T350 (Hercules) | 2.68 |
| Pigment red 57; C.I. 15850/pigment red 184; C.I. 12487 | 40.23 |
| Dipersing agent: Disperbyk 163 | 6.03 |
| Coating Solution for Yellow Pigment Layer: | |
| Alpha-methyl styrene/styrene copolymer, $M_w = 1200$ | 43.23 |
| Polytetrahydrofuran, $M_w = 1000$ | 13.39 |
| Dicyclohexyl phthalate | 6.69 |
| Coating aid: ethyl cellulose EC/T350 (Hercules) | 3.35 |
| Pigment yellow 13; C.I. 21100/Pigment Yellow 83; C.I. 21108 | 28.98 |
| Dispersing agent: Disperbyk 163 | 4.35 |
| Coating Solution for Black Pigment Layer: | |
| Alpha-methyl styrene/styrene copolymer, $M_w = 1200$ | 29.27 |
| Polytetrahydrofuran, $M_w = 1000$ | 9.07 |
| Dicyclohexyl phthalate | 4.53 |
| Coating aid: ethyl cellulose EC/T350 (Hercules) | 2.27 |
| Pigment black 7; C.I. 77266 | 47.70 |
| Dispersing agent: Disperbyk 163 | 7.15 |

For the preparation of a temporary support, a 1.5 μm thick layer of Elvax® 420 (Du Pont, ethylene/vinyl acetate copolymer, 18% vinyl acetate, softening temperature 99° C., ASTM E 28) was coated onto a 100 μm thick polyethylene terephthalate film and dried. In addition, the following materials were utilized to prepare temporary supports with or without an optional interlayer (release layer).

Some useful adhesive layers which were prepared are shown in the following table:

| ADHESIVE LAYER # | INGREDIENTS | AMOUNT (%) |
|---|---|---|
| 1 | Poly (n-butyl methacrylate) | 100 |
| 2 | Poly (isobutyl methacrylate) | 100 |
| 3 | Stereon ® 881 (styrene-butadiene copolymer), Bridgestone/Firestone, Inc., Akron, OH | 100 |
| 4 | Poly (n-butyl methacrylate) | 60 |
|  | Kristalex ® 3085 synthetic aromatic hydrocarbon resin, Hercules, Inc., Wilmington, DE | 40 |
| 5 | Poly (n-butyl methacrylate) | 60 |
|  | Piccolastic ® A5 hydrocarbon resin, Hercules, Inc., Wilmington, DE | 40 |

When the adhesive layer is poly (n-butyl methacrylate) or poly (isobutyl methacrylate), a release layer may be present on the polyethylene terephthalate base. Some useful release layers are listed in the following table:

| RELEASE LAYER # | INGREDIENTS | AMOUNT (%) |
|---|---|---|
| 1 | Gantrez ® 97 maleic acid-methyl vinyl ether Copolymer, ISP Technologies, Inc., Wayne, NJ | 38 |
|  | Elvanol ® 52-22 polyvinyl alcohol resin, DuPont, Wilmington, DE | 39 |
|  | Dimethylethanoiamine | 23 |
| 2 | Uni-Rez ® polyamide resin, Union Camp, Inc. | 95 |
|  | Syloid ® ED-2, W. R. Grace Co., New York, NY | 5 |

The percentage of dimethyl ethanolamine or equivalent neutralizing amine is varied to enable neutralization of the acid component of the maleic acid—methyl vinyl ether copolymer. The relative percentage of the individual resins in the polymeric blends of the release layers may be varied. The amount of silica added to the release layer composition may also vary as long as the essential or desirable features of the release layer are not disrupted.

Example 2

The following materials were prepared and processed for the preparation of multiple proofs:

A coating solution having the following composition in toluene/methanol was applied onto a 50 mm polyethylene terephthalate film, so as to yield, after drying, a 12 μm thick photopolymerizable film. An 18 μm thick, transparent cover sheet was laminated on the film. The molecular weights and Tg's are similar to those in Example 1.

| INGREDIENTS | % BY WEIGHT |
|---|---|
| Ethyl acrylate/acrylic acid copolymer (92/8) $M_w = 7000$ | 3.07 |
| Ethyl acrylate/methyl methacrylate/acrylic acid copolymer (56/37/7), $M_w = 150,000$ | 12.67 |
| Ethyl acrylate/methyl methacrylate/acrylic acid copolymer (17/71/12) $M_w = 200,000$ | 22.30 |
| Diacrylate ester of Bisphenol A epoxy resin (viscosity 1,000,000 cps) | 9.61 |
| Glycerol triacetate | 9.40 |
| Trimethylol propane | 7.70 |
| Hydroquinone monomethyl ether | 0.02 |

| INGREDIENTS | % BY WEIGHT |
|---|---|
| p-(dimethylamino)-benzoic acid ethyl ester | 1.72 |
| 2-mercaptobenzoxazole | 0.81 |
| 7-(4-chloro-6-(diethylamino)-1,3,5-triazin-2-yl)-amino-3-phenyl 1-H benzopyran-2-on | 1.52 |
| Trimethylol propane trimethacrylate | 23.31 |
| Zinc acetylacetonate | 4.05 |
| Polyoxyethylene (4)-lauryl ether | 2.00 |

The following coating solutions in toluene/ethyl acetate (80/20) was applied (Cyan) or may be applied (other colors) onto a 60 μm thick polypropylene foam film, so as to yield, after drying, a 1 μm thick pigmented transfer layer.

Coating Solution for Cyan Pigment Layer:

| INGREDIENTS | % BY WEIGHT |
|---|---|
| Kristalex ® F100 | 50.03 |
| Polytetrahydrofuran | 9.01 |
| Dicyclohexylphthalate | 4.98 |
| Ethyl cellulose EC/T350 | 4.03 |
| Cyan pigment | 24.38 |
| Disperbyk 163 | 4.92 |
| Aerosil ® R972 | 2.65 |

The above ingredients were added in 20% by weight to a toluene/ethyl acetate (80/20) solution to form the coating solution. The remaining pigmented transfer foils may also be prepared analogously to form the four pigmented transfer layers.

For the preparation of a temporary support (transfer sheet) used in the process disclosed herein, the adhesive layer comprised a 1 micron layer of Elvacite® 2046 ( 1:1 mixture of poly(n-butyl methacrylate) and poly(isobutyl methacrylate) and the release layer comprised Uni-Rez® 2654 with 5% (by weight) of Syloid® ED-2.

When processed according to the process described below, Example 2 parallels that described for Example 1 except the pigmented foils using the ingredients and elements in Example 2 are not immediately peeled off the master film (photopolymerizable film) but are peeled off by hand after a holding time of about 10–20s. In addition, with Example 2 ingredients and elements, the transfer sheet is peeled off manually.

Process Of Use

The tonable, photopolymerizable layer was exposed for 42 seconds through a halftone, positive, cyan color separation in a vacuum copying frame with a metal halide lamp (1000 watts) having an ultraviolet filter at a distance of 95 cm. After the cover film was removed, the cyan transfer layer was laminated at room temperature on the imagewise exposed layer and immediately peeled off at about 20 cm/s. The pigmented transfer layer was completely transferred onto the tacky areas without residues on the nontacky areas. The toned layer was then laminated at about 50° C. on a temporary support and immediately peeled off at about 5 cm/s. The pigmented image areas were completely transferred onto the temporary support. The toning of the imagewise exposed layer with new cyan transfer layers and the subsequent transfer of the image areas onto new temporary supports was repeated four times. These process steps were repeated for the magenta, yellow, and black colors. The temporary supports, each bearing a 4-color image, were laminated at 80° C. onto printing papers and after cooling were peeled off at about 10 cm/s. All of the 4-color proofs, from the first to the last, had the required constant quality without changes in resolution or density.

What is claimed is:

1. A process for preparing images on multiple receptors comprising:

a) imagewise exposing a photopolymerizable layer to produce an exposed layer having tacky and nontacky areas thereon;

b) bringing the exposed layer into contact with a pigmented transfer layer on a support, wherein the exposed layer is adjacent the pigmented transfer layer;

c) peeling off the support, whereby the pigmented transfer layer is transferred onto the tacky areas of the exposed layer and is removed from the nontacky areas of the exposed layer to form a toned layer;

d) bringing the toned layer into contact with a temporary support;

e) removing the temporary support, whereupon the pigmented transfer layer adhering to the tacky areas of the photopolymerizable layer is transferred onto the temporary support;

f) bringing the temporary support, having thereon the pigmented transfer layer, into contact with an image receptor;

g) removing the temporary support, whereupon the pigmented transfer layer adhering to the temporary support is transferred onto the image receptor; and h) repeating steps b) through g) at least once, whereby, in each instance, a new pigmented transfer layer, a new temporary support, and a new image receptor are used to form an image on the image receptors.

2. The process according to claim 1, further comprising after step e):

i) repeating steps b) to e) at least once, using in each case a new pigmented transfer layer and a new temporary support, j) repeating steps a) to e) and i) at least once, using in each case a new photopolymerizable layer, a new pigmented transfer layer, and the temporary supports toned in the preceding steps, k) bringing the temporary supports into contact with an image receptor, and l) removing the temporary supports, whereupon the pigmented transfer layers adhering on the temporary supports are transferred onto the image receptors.

3. The process according to claim 1, further comprising after step e ):

m) repeating steps a) to e) at least once, using in each case a new photopolymerizable layer, a new pigmented transfer layer, and the temporary support toned in the preceding steps, n) bringing the temporary support into contact with an image receptor, o) removing the temporary support, whereupon the pigmented transfer layers adhering on the temporary support are transferred onto the image receptor, and p) repeating steps b) to e), m) to o) at least once, using new pigmented transfer layers in steps b) and m), a new temporary support in step d), and a new image receptor in step n).

4. The process according to claims 1, 2 or 3 wherein (a) the support in step c) is peeled off at a velocity of about 10 to 50 cm/s; or (b) the temporary support in step e) is peeled off at a velocity of about 2–5 cm/s; or both (a) and (b) and wherein the photopolymerizable layer comprises a photopolymerizable material having at least one polymeric binder, at least one ethylenically unsaturated photopolymerizable monomer, and at least one photoinitiator, wherein the layer is ≧10 mm thick, and wherein the photopolymerizable material has a complex shear modulus of 170–700 kPa at 25° C., measured at 10 Hz and tau 9750 Pa.

5. The process according to claim 4, wherein the photopolymerizable layer further comprises at least one plasticizing component.

6. The process according to claim 5, wherein the pigmented transfer layer comprises at least one compound selected the group consisting of a polymer, a plasticized polymer and mixtures thereof, wherein the compound is compatible with at least one of the plasticizing components of the photopolymerizable layer.

7. The process according to claim 6, wherein the temporary support comprises a flexible, dimensionally stable base layer;

an adhesive layer comprising a 2–5 μm thick coating containing at least one thermoplastic polymer having a softening temperature of +25° to +130° C., wherein the coating is compatible with at least one of the plasticizing components of the photopolymerizable layer or the pigmented transfer layer and an optional release layer between the base layer and adhesive layer.

8. The process according to claim 7, wherein the temporary support comprises a flexible, dimensionally stable base layer selected from polyethylene terephthalate, matte polyethylene terephthalate, or gelatin subbed polyethylene terephthalate; and the thermoplastic polymer of the adhesive layer comprises poly (n-butyl methacrylate; or poly (isobutyl methacrylate); or styrene-buradiene copolymer; or a blend of poly (n-butyl methacrylate) and an aromatic hydrocarbon resin in a ratio by weight of 1:100 to 100:1; or a blend of styrene-butadiene copolymer and polystyrene resin in a ratio by weight of 1:100 to 100: 1; or combinations thereof; and the release layer comprises (a) a blend of maleic acid-methyl vinyl ether copolymer; poly (vinyl alcohol) and a maleic acid neutralizing amine wherein the ratio of maleic acid-methyl vinyl ether to poly (vinyl alcohol) ranges from 1:100 to 100:1; or (b) a blend of a polyamide resin and a silica matting agent in a ratio by relative weight of 1000:1 to 9:1.

9. A process for producing multiple copies of images on image receptors, comprising:

(a) imagewise exposing a photopolymerizable element comprising a support, photopolymerizable layer and a coversheet with actinic radiation to form an imagewise exposed photopolymerized element with tacky and non-tacky areas, (b) removing the coversheet to form an imagewise exposed photopolymerized layer, (c) adhering a pigmented transfer layer on a support to the imagewise exposed photopolymerized layer to form an element comprising, in order, the support, the pigmented transfer layer, and the imagewise exposed photopolymerized layer, (d) peeling off the support and the pigmented transfer layer to form pigmented photopolymerized layer, (e) adhering a temporary support to the pigmented photopolymerized layer and peeling off the pigment from the photopolymerized layer to form an imagewise pigmented temporary support and the imagewise exposed photopolymerized layer, (f) repeating steps (c)–(e) to form a plurality of imagewise pigmented temporary supports, and (g) adhering the plurality of imagewise pigmented temporary supports to a plurality of image receptors to form, after peeling and cooling, multiple copies of color proofs.

10. A process for producing multiple copies of multicolor images on image receptors, comprising:

(a) imagewise exposing a photopolymerizable element comprising a support, photopolymerizable layer and a coversheet with actinic radiation to form an imagewise exposed photopolymerized element, (b) removing the coversheet to form an imagewise exposed photopolymerized layer, (c) adhering a pigmented transfer layer on a support to the imagewise exposed photopolymerized layer to form an element comprising, in order, the support, the pigmented transfer layer, and the imagewise exposed photopolymerized layer, (d) peeling off the support and the pigmented transfer layer to form a pigmented photopolymerized layer, (e) adhering a temporary support to the pigmented photopolymerized layer and peeling off the pigment from the photopolymerized layer to form an imagewise pigmented temporary support and the imagewise exposed photopolymerized layer, (f) repeating steps (c)–(e) to form a plurality of imagewise pigmented temporary supports, (g) repeating steps (a)–(d) to form a plurality of pigmented photopolymerized layers, (h) adhering the pigmented photopolymerized layers produced in step (g) to the plurality of imagewise pigmented temporary supports produced in step (f) to form a multicolor pigmented image on the temporary supports, and (i) adhering the plurality of multicolor pigmented images on the temporary supports to a plurality of image receptors to form, after peeling and cooling, multiple copies of multicolor proofs.

\* \* \* \* \*